(12) United States Patent
Seo

(10) Patent No.: US 10,340,294 B2
(45) Date of Patent: Jul. 2, 2019

(54) METHOD FOR MANUFACTURING THIN FILM TRANSISTOR, AND THIN FILM TRANSISTOR

(71) Applicant: INDUSTRY-UNIVERSITY COOPERATION FOUNDATION KOREA AEROSPACE UNIVERSITY, Goyang-si, Gyeonggi-do (KR)

(72) Inventor: Jong Hyun Seo, Goyang-si (KR)

(73) Assignee: INDUSTRY-UNIVERSITY COOPERATION FOUNDATION KOREA AEROSPACE UNIVERSITY, Goyang-si, Gyeonggi-Do (KR)

( * ) Notice: Subject to any disclaimer, the term of this patent is extended or adjusted under 35 U.S.C. 154(b) by 0 days.

(21) Appl. No.: 15/518,927

(22) PCT Filed: Oct. 14, 2015

(86) PCT No.: PCT/KR2015/010811
§ 371 (c)(1),
(2) Date: Apr. 13, 2017

(87) PCT Pub. No.: WO2016/060455
PCT Pub. Date: Apr. 21, 2016

(65) Prior Publication Data
US 2017/0243891 A1    Aug. 24, 2017

(30) Foreign Application Priority Data
Oct. 14, 2014 (KR) ................. 10-2014-0138158

(51) Int. Cl.
*H01L 27/12* (2006.01)
*H01L 29/66* (2006.01)
*H01L 29/786* (2006.01)

(52) U.S. Cl.
CPC ........ *H01L 27/124* (2013.01); *H01L 27/1225* (2013.01); *H01L 29/66969* (2013.01); *H01L 29/7869* (2013.01)

(58) Field of Classification Search
CPC ............. H01L 29/7869; H01L 27/1225; H01L 27/1288
See application file for complete search history.

(56) References Cited

U.S. PATENT DOCUMENTS

2007/0072439 A1\* 3/2007 Akimoto ............. H01L 27/1225
438/795
2012/0064677 A1\* 3/2012 Miyairi ............. H01L 29/66765
438/157
(Continued)

FOREIGN PATENT DOCUMENTS

JP    2011014761 A    1/2011
KR    1020070044316 A    4/2007
(Continued)

OTHER PUBLICATIONS

International Search Report of PCT/KR2015/010811, dated Jan. 25, 2016, 5 pages.

*Primary Examiner* — Changhyun Yi
(74) *Attorney, Agent, or Firm* — Hamre, Schumann, Mueller & Larson, P.C.

(57) ABSTRACT

Disclosed is a method for manufacturing a thin film transistor. The method for manufacturing a thin film transistor includes: forming a patterned semiconductor layer and a patterned wiring layer on a substrate; and etching the wiring layer to form a channel part. Herein, the wiring layer includes a compensation layer and the compensation layer is formed from a material including a metal of a metal oxide component among components of a material forming the semiconductor layer.

17 Claims, 13 Drawing Sheets

(56) References Cited

U.S. PATENT DOCUMENTS

| | | | |
|---|---|---|---|
| 2012/0138923 A1 | 6/2012 | Hara et al. | |
| 2013/0056729 A1* | 3/2013 | Misaki | H01L 27/1225 257/43 |
| 2015/0171154 A1* | 6/2015 | Kang | H01L 23/53238 257/40 |

FOREIGN PATENT DOCUMENTS

| | | |
|---|---|---|
| KR | 1020090117543 A | 11/2009 |
| KR | 1020100120939 A | 11/2010 |
| KR | 1020120096879 A | 8/2012 |
| TW | 201244114 A | 11/2012 |

\* cited by examiner

US 10,340,294 B2

METHOD FOR MANUFACTURING THIN FILM TRANSISTOR, AND THIN FILM TRANSISTOR

TECHNICAL FIELD

The present disclosure relates to a method for manufacturing a thin film transistor, and a thin film transistor.

BACKGROUND

Metal oxide semiconductors are generally suitable for large area and high resolution. Such metal oxide semiconductors have been used in an organic electro luminescence (EL) display and liquid crystal display (LCD). Conventionally, four mask processes have been employed to manufacture a thin film transistor using a metal oxide semiconductor. In order to perform the four mask processes, a back channel etching (BCE) method needs to be applied.

However, in the conventional method for manufacturing a thin film transistor according to the back channel etching method, there has been a problem of a partial loss of a surface of the metal oxide semiconductor. Specifically, during an etching process, an etchant may cause a partial loss of a surface of the metal oxide semiconductor. The loss of the surface of the metal oxide semiconductor results in degradation of electrical characteristics of the thin film transistor and thus needs to be solved.

DISCLOSURE OF THE INVENTION

Problems to be Solved by the Invention

The present disclosure provides a method for manufacturing a thin film transistor and a thin film transistor manufactured by the method capable of solving a problem caused by a surface loss of a metal oxide semiconductor occurring when the thin film transistor is manufactured.

Means for Solving the Problems

As a technical means for solving the above-described problem, a method for manufacturing a thin film transistor according to a first aspect of the present disclosure includes: forming a patterned semiconductor layer and a patterned wiring layer on a substrate; and etching the wiring layer to form a channel part. Herein, the wiring layer includes a compensation layer and the compensation layer is formed from a material including a metal of a metal oxide component among components of a material forming the semiconductor layer.

Further, according to a second aspect of the present disclosure, a thin film transistor includes a semiconductor layer and a wiring layer on a substrate, and the wiring layer includes a compensation layer. Herein, the compensation layer is formed from a material including a metal of a metal oxide component among components of a material forming the semiconductor layer.

Effects of the Invention

According to the above-described aspects of the present disclosure, the compensation layer compensates for a loss of the semiconductor layer, so that a change in surface composition of the semiconductor layer can be suppressed. Therefore, a thin film transistor with maximized electrical characteristics can be implemented. Further, the compensation layer can suppress the generation of residue. Therefore, a thin film transistor with improved reliability can be implemented.

MODE FOR CARRYING OUT THE INVENTION

Figure 1:
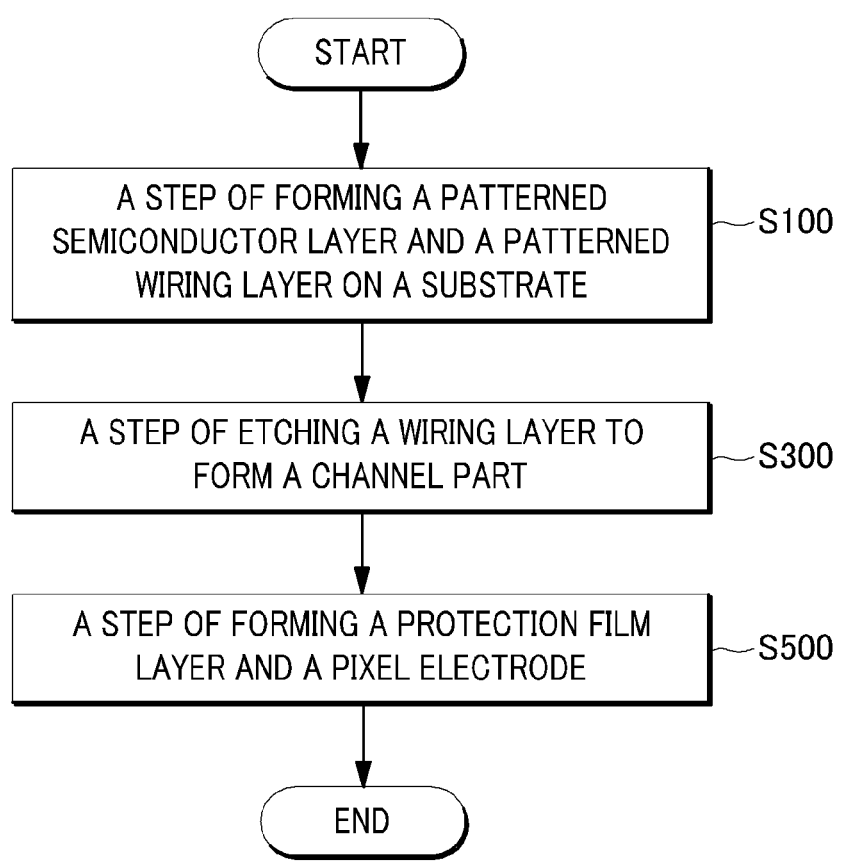
FIG. 1 is a schematic flowchart provided to explain a method for manufacturing a thin film transistor in accordance with an example of the present disclosure.

Hereinafter, examples of the present disclosure will be described in detail with reference to the accompanying drawings so that the present disclosure may be readily implemented by those skilled in the art. However, it is to be noted that the present disclosure is not limited to the examples but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Through the whole document, the term "on" that is used to designate a position of one element with respect to another element includes both a case that the one element is adjacent to the another element and a case that any other element exists between these two elements.

Further, through the whole document, the term "comprises or includes" and/or "comprising or including" used in the document means that one or more other components, steps, operation and/or existence or addition of elements are not excluded in addition to the described components, steps, operation and/or elements unless context dictates otherwise. Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

FIG. 1 is a schematic flowchart provided to explain the present method for manufacturing a thin film transistor.

Figure 2A:
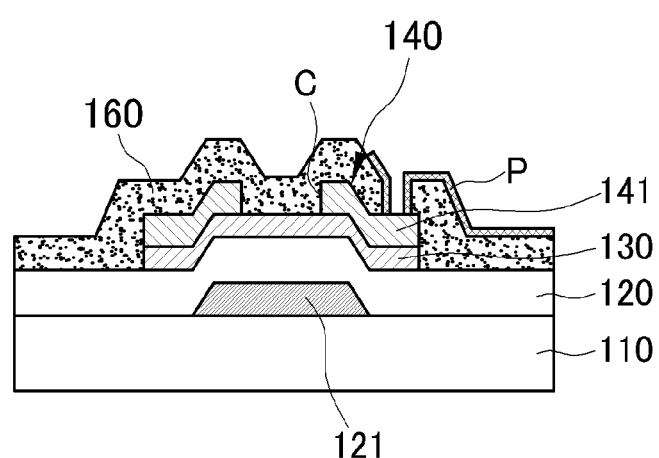
FIG. 2A is a cross-sectional view of a thin film transistor having a bottom-gate structure according to the method for manufacturing a thin film transistor in accordance with an example of the present disclosure.
Figure 2B:
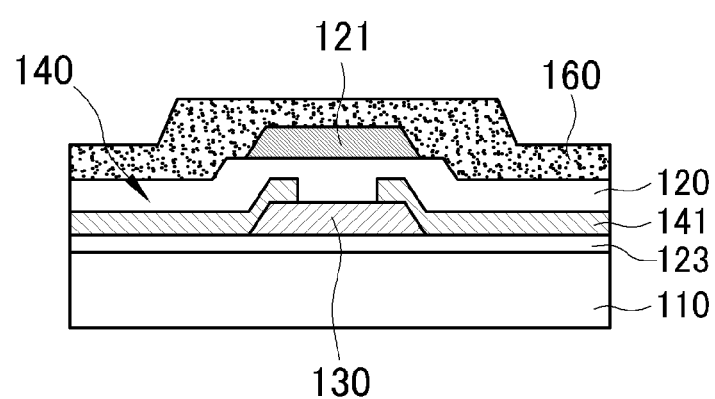
FIG. 2B is a cross-sectional view of a thin film transistor having a top-gate structure according to the method for manufacturing a thin film transistor in accordance with an example of the present disclosure.

FIG. 2A is a cross-sectional view of a thin film transistor having a bottom-gate structure according to the present method for manufacturing a thin film transistor, and FIG. 2B is a cross-sectional view of a thin film transistor having a top-gate structure according to the present method for manufacturing a thin film transistor. For reference, an illustration of a pixel electrode is omitted in FIG. 2B.

Referring to FIG. 1, the present method for manufacturing a thin film transistor includes forming a patterned semiconductor layer 130 and a patterned wiring layer 140 on a substrate 110 (S100) and etching the wiring layer 140 to form a channel part C (S300).

Referring to FIG. 2A and FIG. 2B, the wiring layer 140 includes a compensation layer (buffer layer) 141. The compensation layer 141 is formed from a material which includes a metal of a metal oxide component among components of a material forming the semiconductor layer 130.

The compensation layer 141 may compensate for a loss of the semiconductor layer 130. However, the compensation layer is not limited to the above-described function, and may suppress the generation of residue during the etching process.

According to a conventional method for manufacturing a thin film transistor, there has been a problem of a partial loss of a surface of a semiconductor layer.

Figure 3:
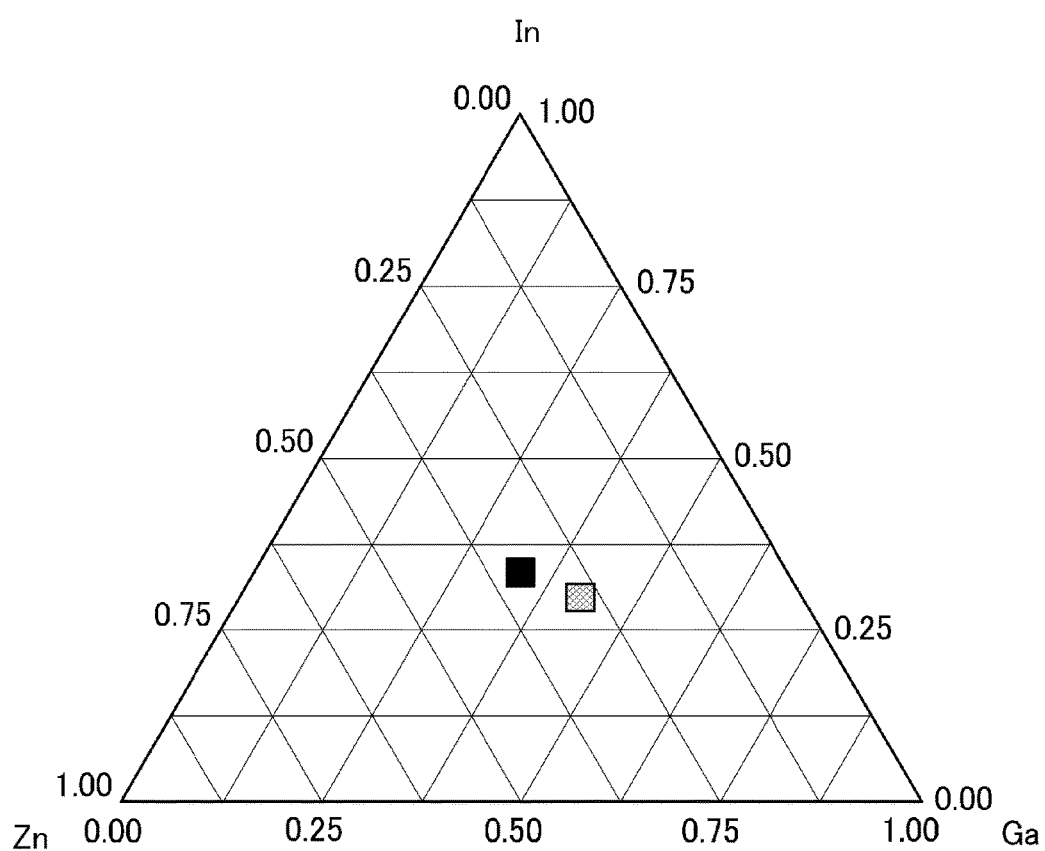
FIG. 3 is a graph showing the result of X-ray photoelectron spectroscopy of a semiconductor before an etching process and the semiconductor after the etching process in a conventional method for manufacturing a thin film transistor on a three-element composition diagram.

For example, according to the conventional method for manufacturing a thin film transistor, there has been a problem of a partial loss of a surface of a semiconductor layer during an etching process. This will be explained with reference to FIG. 3. FIG. 3 is a graph showing the result of X-ray photoelectron spectroscopy (XPS) of a semiconductor before an etching process and the semiconductor after the etching process in the conventional method for manufacturing a thin film transistor on a three-element composition diagram. Full Black Square denotes a resulting value of the semiconductor layer before the etching process and Black Edged Square denotes a resulting value of the semiconductor layer after the etching process.

From a position of a black dot in FIG. 3, it can be seen that a ratio of $Ga_2O_3$, $In_2O_3$, and ZnO in the semiconductor layer before the etching process is about 1:1:1. Also, from a position of a red dot in FIG. 3, it can be seen that ZnO is insufficient in the semiconductor layer after the etching process and $Ga_2O_3$ and $In_2O_3$ increase in amount.

Generally, when a composition ratio of $Ga_2O_3$, $In_2O_3$, and ZnO is from about 1:1:1 to about 1:1:2, a semiconductor layer has excellent electron mobility and threshold voltage (Vth). Also, generally, when the composition ratio of $Ga_2O_3$, $In_2O_3$, and ZnO is about 1:1:1, in the semiconductor layer being applied with a bias voltage, a $V_{th}$ shift caused by external light irradiation can be minimized.

That is, according to the conventional method for manufacturing a thin film transistor, as described above, there is a change in surface composition of the semiconductor layer after the etching process is performed. Such a change is inevitable according to the conventional method for manufacturing a thin film transistor. Also, the change in surface composition results in degradation in performance of the manufactured thin film transistor.

However, according to the present method for manufacturing a thin film transistor, the compensation layer 141 can compensate for a loss of the semiconductor layer 130. In other words, a surface composition of the semiconductor layer 130 can be adjusted by the compensation layer 141. Therefore, it is possible to suppress degradation in performance of the thin film transistor.

Also, the compensation layer 141 can solve residue problem.

According to the conventional method for manufacturing a thin film transistor, during the etching process, residue is caused by an etchant. For example, conventionally, an etchant including hydrogen peroxide, a persulfate-based material, and a phosphate-based material at low concentrations has been used in order to minimize damage to the semiconductor layer. In this case, residue of molybdenum is unavoidable.

However, according to the present method for manufacturing a thin film transistor, the compensation layer 141 can improve etching characteristics. Therefore, even if etching is performed using an etchant including hydrogen peroxide, a persulfate-based material, and a phosphate-based material at low concentrations, it is possible to suppress the generation of residue.

A composition relevant to the present method for manufacturing a thin film transistor will be described in detail below.

The semiconductor layer 130 may be formed from a material including a metal oxide. For example, the semiconductor layer 130 may be formed from a material including one or more of $In_2O_3$, ZnO, $Ga_2O_3$, $SnO_2$, $TiO_2$, HfO, $Ta_2O_5$, and $Al_2O_3$. Particularly, the semiconductor layer 130 may be formed from IGZO including indium, gallium, zinc, and oxygen.

Further, the compensation layer 141 may be formed from a material including one or more of molybdenum (Mo) and titanium (Ti).

According to the above description, for example, a material forming the compensation layer 141 may include one or more of molybdenum (Mo) and titanium (Ti) as main components. Also, the material forming the compensation layer 141 may include one or more of Al, Zn, In, Ga, Sn, Ti, Hf, and Ta as secondary components. However, ingredients of the material forming the compensation layer 141 are not limited thereto. The material forming the compensation layer 141 may include tungsten (W) depending on the kind of a material forming the semiconductor layer 130.

Particularly, the compensation layer 141 formed from a material including molybdenum (Mo) and zinc (Zn) may be implemented.

With the wiring layer 140 including the compensation layer 141, a zinc (Zn)-rich area can be formed on a surface of the semiconductor layer 130, so that it is possible to compensate for a loss of ZnO from the semiconductor layer 130.

As described above, according to the conventional method for manufacturing a thin film transistor, in the surface composition of the semiconductor layer after the etching process, ZnO is insufficient and $Ga_2O_3$ and $In_2O_3$ tend to increase in amount. However, according to the present method for manufacturing a thin film transistor, the compensation layer 141 formed from a material including molybdenum (Mo) and zinc (Zn) can compensate for a loss of ZnO from the semiconductor layer 130.

However, in an exemplary embodiment of the compensation layer 141, only the above-described compensation layer 141 formed from a material including molybdenum (Mo) and zinc (Zn) is not implemented. As described above, the compensation layer 141 may include one or more of molybdenum (Mo) and titanium (Ti) as main components and also one or more of Al, Zn, In, Ga, Sn, Ti, Hf, Ta, and W as secondary components, and, thus, can be implemented in various exemplary embodiments.

Meanwhile, the compensation layer 141 may include a metal of a metal oxide component among components of a material forming the semiconductor layer at a predetermined composition ratio. Details thereof will be described with reference to FIG. 4 and FIG. 5.

Figure 4:
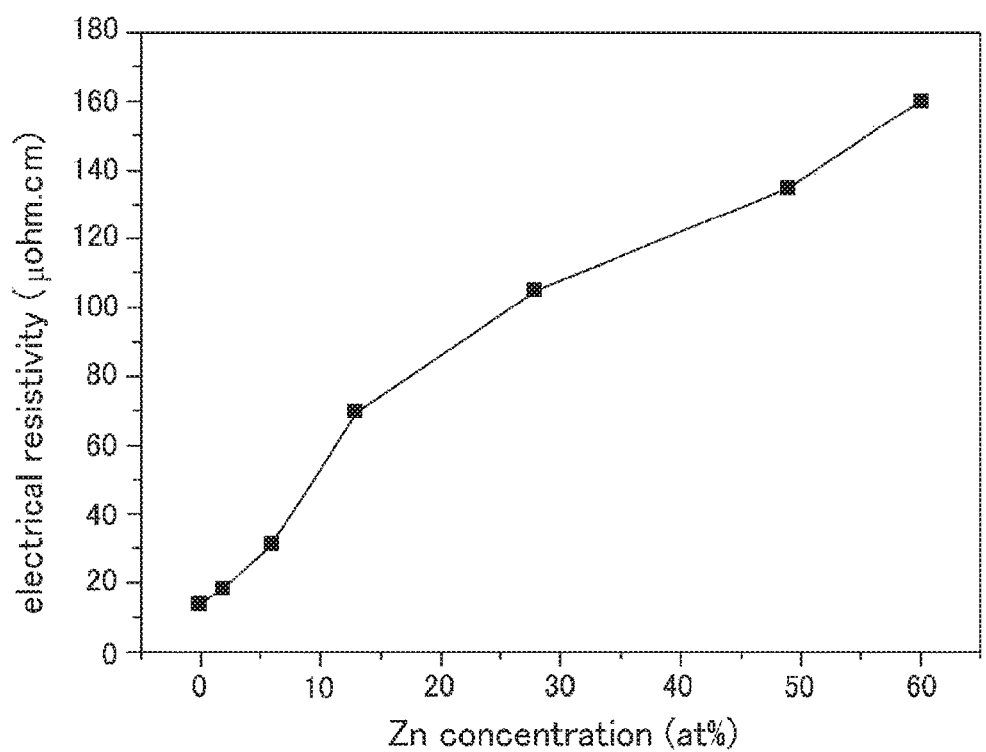
FIG. 4 is a graph showing a change in electrical conductivity of a compensation layer with an increase in zinc concentration in the compensation layer including molybdenum and zinc.
Figure 5:
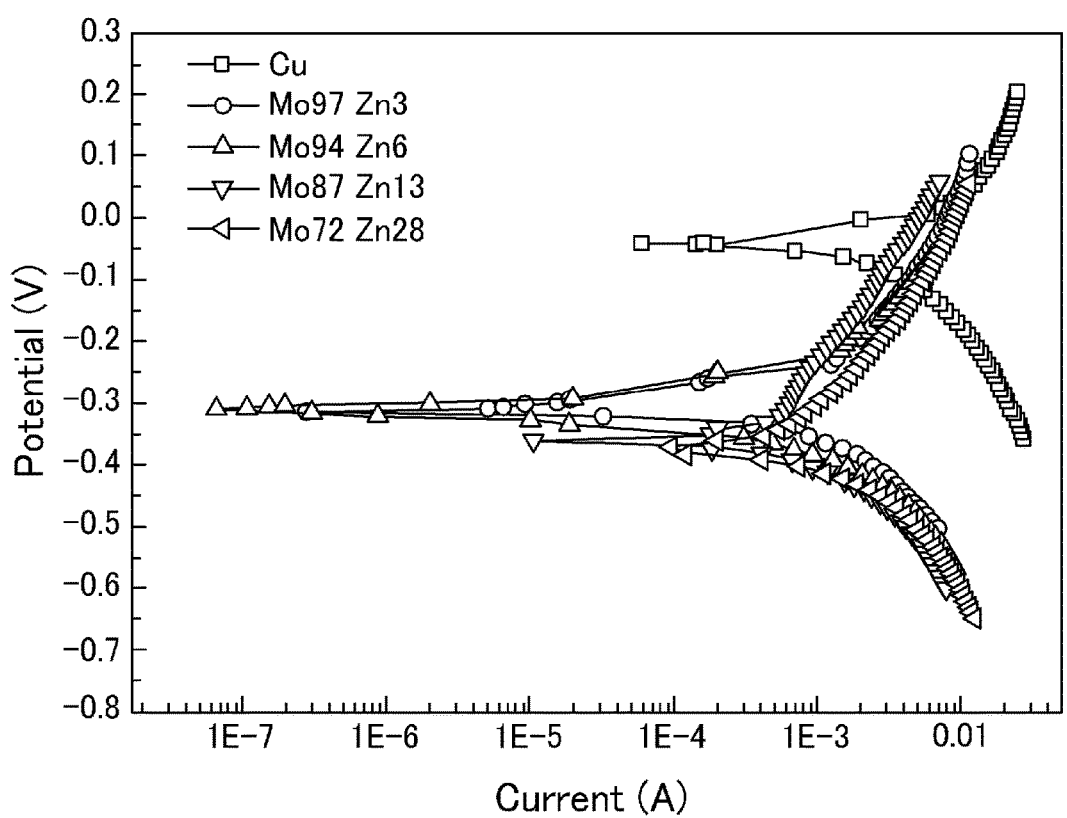
FIG. 5 is a graph showing a change in electrochemical characteristics of an etchant with an increase in zinc concentration in the compensation layer including molybdenum and zinc.

FIG. 4 is a graph showing a change in electrical conductivity of a compensation layer with an increase in zinc concentration in the compensation layer including molybdenum and zinc. In FIG. 4, the x-axis represents zinc concentration (at %) and the y-axis represents electrical resistivity (μohm·cm). FIG. 5 is a graph showing a change in electrochemical characteristics of an etchant with an increase in zinc concentration in the compensation layer including molybdenum and zinc. In FIG. 5, the x-axis represents current (A) and the y-axis represents voltage potential (V).

For example, if the compensation layer 141 includes molybdenum and zinc, a resistivity of the compensation layer 141 may increase almost linearly with an increase in zinc concentration. This may be because electron-phonon scattering increases along with an increase in zinc concentration.

Further, referring to FIG. 5, an electrochemical potential may decrease to an active state (in an active direction) with an increase in zinc concentration in the compensation layer 141, so that a galvanic phenomenon may be intensified to further increase an etching rate of the compensation layer 141. That is, if the compensation layer 141 contains zinc in a predetermined amount or more, undercut may occur during the etching process. Therefore, desirably, the compensation layer 141 may include a metal of a metal oxide component among components of a material forming the semiconductor layer 130 at a predetermined composition ratio.

For example, the material forming the compensation layer 141 may include a metal of a metal oxide component among components of a material forming the semiconductor layer 130 ranging from 5 at % to 70 at %.

More specifically, if the material forming the compensation layer 141 includes molybdenum (Mo) and zinc (Zn), the material may include 50 at % molybdenum and 50 at % zinc.

For reference, if the compensation layer 141 includes a metal of a metal oxide component among components of a material forming the semiconductor layer 130 at a low concentration, the compensation layer 141 can suppress the generation of residue during the etching process. If the compensation layer 141 includes a metal of a metal oxide component among components of a material forming the semiconductor layer 130 at a high concentration, the compensation layer 141 can suppress the generation of residue and also improve electrical characteristics of the semiconductor layer 130 by compensating for a loss of the semiconductor layer 130.

That is, the compensation layer 141 can suppress the generation of residue and also compensate for a loss of the semiconductor layer 130.

Figure 6:
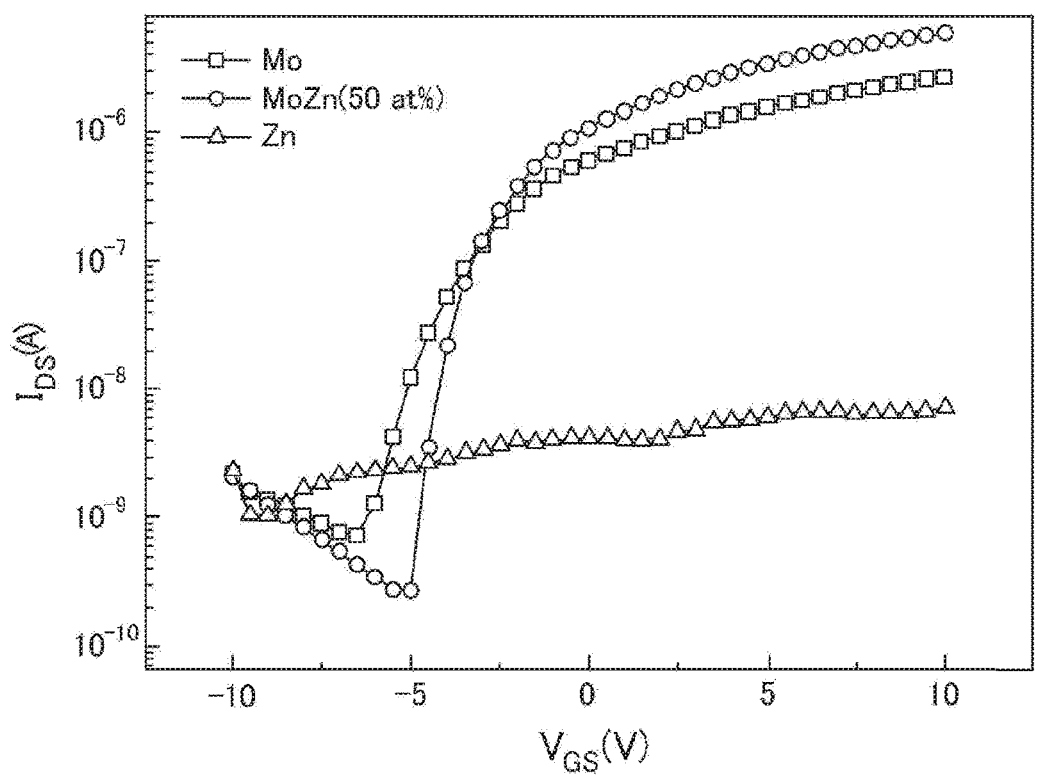
FIG. 6 is a graph showing a change in transfer I-V curve when each of a wiring layer formed from molybdenum, a wiring layer formed from zinc, and a wiring layer formed from a material including molybdenum and zinc is applied to a metal oxide semiconductor thin film transistor.

FIG. 6 is a graph showing a change in transfer I-V curve when each of a wiring layer formed from molybdenum, a wiring layer formed from zinc, and a wiring layer formed from a material including molybdenum and zinc (i.e., the wiring layer 140 manufactured according to the present method for manufacturing a thin film transistor) is applied to a thin film transistor. For reference, in the thin film transistor, a semiconductor layer includes a metal oxide. In FIG. 6, the x-axis represents $V_{GS}$ (V) and the y-axis represents $I_{DS}$ (A). $V_{GS}$ (V) indicates DC gate to source voltage and $I_{DS}$ (A) indicates DC drain to source current.

Referring to FIG. 6, it can be seen that a drain current On/Off ratio of the thin film transistor to which the wiring layer formed from a material including molybdenum and zinc is applied is increased by about 10 times as compared with a drain current On/Off ratio of the thin film transistor to which the wiring layer formed from molybdenum is applied, and improvement in electron mobility and $V_{th}$ shift can be seen. Also, it can be seen that the thin film transistor to which the wiring layer formed from pure zinc is applied has poor characteristics.

Meanwhile, as illustrated in FIG. 2A and FIG. 2B, the wiring layer 140 may have a single structure including the compensation layer 141. In other words, the compensation layer 141 may be the wiring layer 141.

Figure 7:
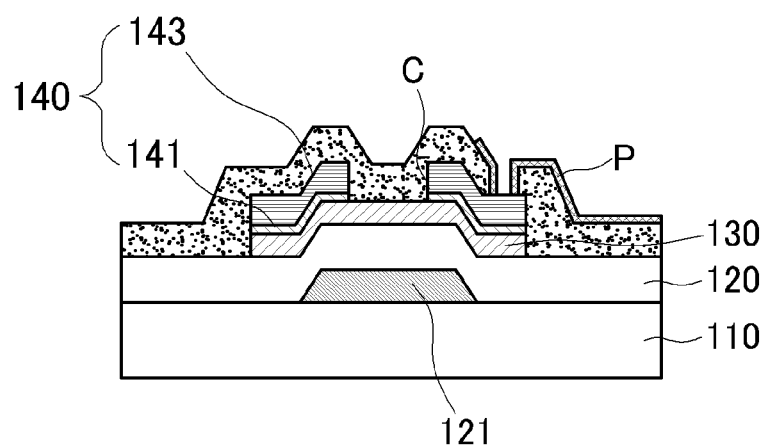
FIG. 7 is a schematic cross-sectional view illustrating an exemplary embodiment of a thin film transistor implemented by a method for manufacturing a thin film transistor in accordance with an example of the present disclosure, which is provided to explain a wiring layer having a double structure.

Referring to FIG. 7, the wiring layer 140 may include a metal layer 143 formed opposite to the semiconductor layer 130 with the compensation layer 141 interposed therebetween. In other words, as illustrated in FIG. 3, the wiring layer 140 may have a double structure including the compensation layer 141 and the metal layer 143. The metal layer 143 may include one or more of copper, a copper alloy, aluminum, an aluminum alloy, silver, a silver alloy, and the like.

Further, the wiring layer 140 may include an additional compensation layer formed opposite to the compensation layer 141 with the metal layer 143 interposed therebetween. In this case, although not illustrated in the drawing, the wiring layer 140 may be implemented as a triple structure including the compensation layer 141 formed on the semiconductor layer 130 and the metal layer 143 and the additional compensation layer formed in sequence on the compensation layer 141. A composition and a function of the additional compensation layer may be identical or similar to those of the compensation layer 141.

The wiring layer 140 may further include a transparent conductive layer formed opposite to the metal layer with the additional compensation layer interposed therebetween. In this case, the wiring layer 140 may be implemented as a quadruple structure including the compensation layer 141 formed on the semiconductor layer 130 and the metal layer 143, the additional compensation layer, and the transparent conductive layer formed in sequence on the compensation layer 141. The transparent conductive layer may be formed from a transparent conductive oxide (TCO).

Further, in the step of etching the wiring layer 140 to form a channel part C (S300) in the present method for manufacturing a thin film transistor, an etchant may be a phosphate-based solution.

Also, the etchant may include chlorine ions.

Moreover, the etchant may be based on hydrogen peroxide.

That is, for example, the etchant may include 8 wt % hydrogen peroxide ($H_2O_2$), 3 wt % glycine, 2 wt % ammonium fluoride ($NH_3F$), 0.02 wt % hydrogen fluoride (HF), 0.08 wt % phosphate ($H_3PO_4$), and 86.9 wt % distilled water (DI water).

Meanwhile, hereinafter, the step S100 will be described. Herein, a thin film transistor having a bottom-gate structure will be mainly described, and a single structure in which the wiring layer 140 is the compensation layer 141 will be described.

FIG. 8A to FIG. 8E are schematic cross-sectional views provided to explain the present method for manufacturing a thin film transistor.

The step S100 may include preparing a substrate 110. The substrate 110 may be formed from one of, e.g., glass, polymer, metal, silicon wafer, and the like.

Figure 8A:
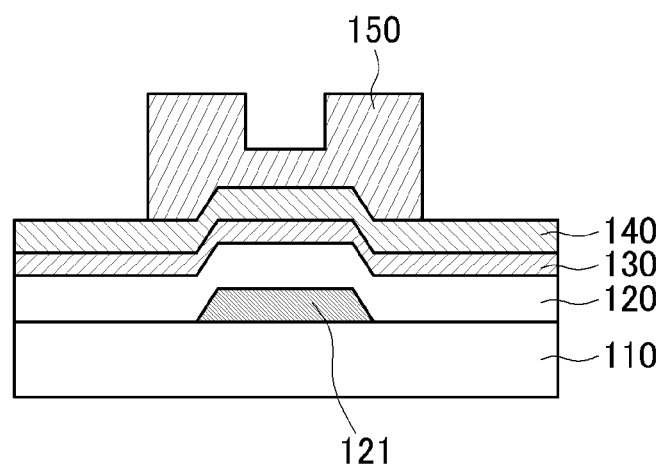
FIG. 8A to FIG. 8E are schematic cross-sectional views provided to explain the present method for manufacturing a thin film transistor.

If a thin film transistor having a bottom-gate structure is implemented, a gate electrode 121 and a gate insulation layer 120 may be formed on the substrate 110 as illustrated in FIG. 8A. In this case, the gate insulation layer 120 may be formed by dry deposition.

For reference, if a thin film transistor having a top-gate structure is implemented, an insulation layer 123 may be formed on the substrate 110 as illustrated in FIG. 2B. The insulation layer 123 may include one or more of SiNx, $SiO_2$.

Also, in the present method for manufacturing a thin film transistor, the step S100 may include forming a semiconductor layer 130 on the substrate 110 and forming a wiring layer 140.

Specifically, the step of forming the semiconductor layer 130 on the substrate 110 and the step of forming the wiring layer 140 may be performed in sequence. Therefore, referring to FIG. 8A, the semiconductor layer 130 and the wiring layer 140 may be formed in sequence. The semiconductor layer 130 and the wiring layer 140 may be formed by deposition, particularly, sputtering. Therefore, the productivity can be improved and the reliability of a thin film interface can also be improved.

Also, referring to FIG. 8A, the step S100 may include forming a patterned mask layer 150 on the wiring layer 140. For example, the mask layer 150 may be a photo resist (PR) layer. In this case, the step of forming a patterned mask layer 150 may include coating photo resist on the wiring layer 140, performing exposure and development, and forming the photo resist into a circuit shape.

Figure 8B:
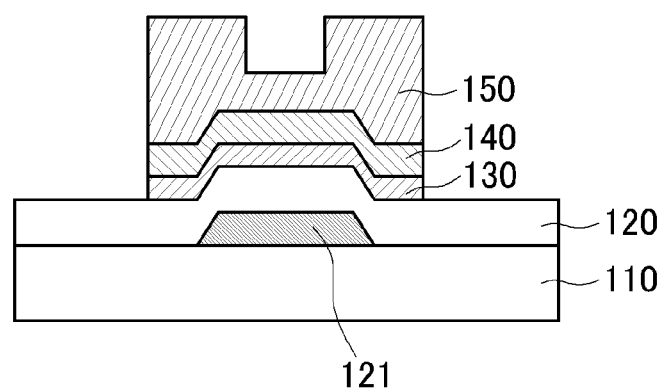

Further, referring to FIG. 8B, the step S100 may include patterning the semiconductor layer 130 and the wiring layer 140. The semiconductor layer 130 and the wiring layer 140 may be patterned using the patterned mask layer 150.

Figure 8C:
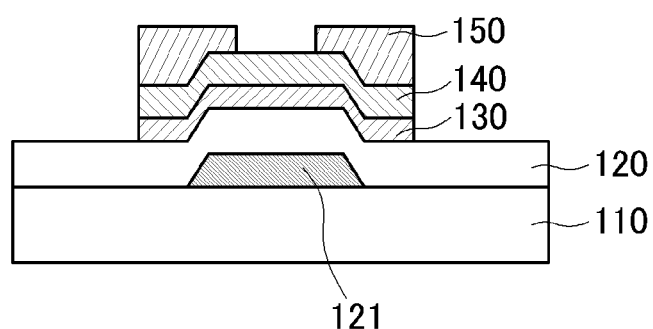
Figure 8D:
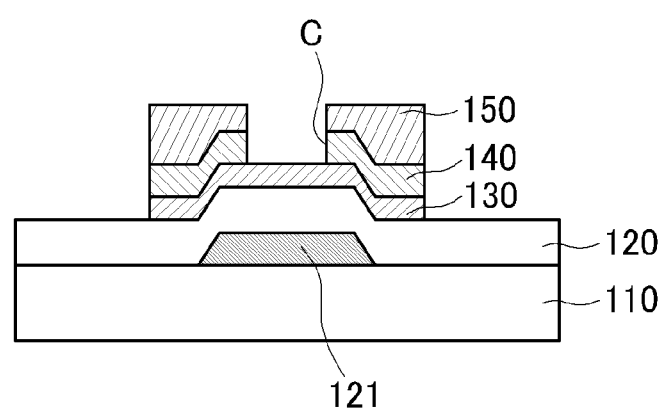

Furthermore, referring to FIG. 8C, the step S100 may include removing the mask layer 150. In the step of removing the mask layer 150, oxygen plasma is generated using an $O_2$ asher, i.e., plasma asher, to remove the mask layer 150. In this case, only an upper part of the mask layer 150 may be removed as illustrated in FIG. 8C. Otherwise, the entire mask layer 150 may be removed.

After the step of removing the mask layer 150 is performed, the above-described step S300 may be performed. In this case, if only the upper part of the mask layer 150 is removed, the step S300 may be performed using the mask layer 150 of which the upper part is removed. Otherwise, if the entire mask layer 150 is removed, a separate mask layer may be newly formed before the step S300 is performed.

According to the present method for manufacturing a thin film transistor, in another exemplary embodiment, the step S100 may be performed as follows.

The step S100 may include preparing the substrate 110, forming the semiconductor layer 130 on the substrate 110, patterning the semiconductor layer 130, forming the wiring layer 140, and patterning the wiring layer 140. These steps may be performed in sequence.

For example, in the step of preparing a substrate 110, the substrate 110 may be formed from one of, e.g., glass, polymer, metal, silicon wafer, and the like. For example, the substrate 110 may be a $SiO_2$ oxidation wafer. Also, as described above, a gate electrode 121 and a gate insulation layer 120 may be formed on the substrate 110. Otherwise, a insulation layer 123 may be formed thereon.

Further, in the step of forming the semiconductor layer 130 on the substrate 110, the semiconductor layer 130 may be deposited by sputtering. For example, the semiconductor layer 130 may be deposited to a thickness of 100 nm. A pulsed DC sputtering system may be used in the deposition process.

Furthermore, the step of patterning the semiconductor layer 130 may include forming a mask layer (photo resist layer) patterned into the circuit shape on the semiconductor layer 130. In the step of forming the mask layer, photo resist may be coated on the semiconductor layer 130 and then exposed and developed to be formed into the circuit shape. In the step of patterning the semiconductor layer 130, the semiconductor layer 130 may be etched using the mask layer patterned into the circuit shape.

In the step of forming the wiring layer 140, the wiring layer 140 may be deposited by sputtering. For example, a DC magnetron sputtering system may be used.

Moreover, the step of patterning the wing layer 140 may include forming the mask layer (photo resist layer) patterned into the circuit shape on the wiring layer 140. Then, the wiring layer 140 may be patterned into the circuit shape using the mask layer.

Then, as described above in the step S100 according to an exemplary embodiment of the present disclosure, only the upper part of the mask layer or the entire mask layer may be removed and then, the step S300 may be performed.

The present method for manufacturing a thin film transistor may further include activating the semiconductor layer 130.

In the step of activating the semiconductor layer 130, light may be irradiated to the surface of the semiconductor layer 130.

Also, in the step of activating the semiconductor layer 130, light may be irradiated to the surface of the semiconductor layer 130 in a state where at least a part of the surface of the semiconductor layer 130 is in contact with a fluid.

For example, after the thin film transistor is immersed in the fluid, light may be irradiated thereto. However, the present disclosure is not limited thereto. For example, after the fluid may be sprayed only onto the surface of the semiconductor layer 130 or the surface of the semiconductor layer 130 and the surface of the wiring layer 140, light may be irradiated thereto.

Further, the fluid may include moisture $H_2O$. If light is irradiated to the surface of the semiconductor layer 130 in contact with the fluid, a decrease of trap sites caused by photocatalytic reaction can be maximized. Also, an increase in electron density caused by an increase in oxygen vacancy can be maximized. Besides, weak bonding in the semiconductor layer 130 can be removed. Accordingly, there may be a positive change in interfacial properties of the semiconductor layer 130.

Furthermore, in the step of irradiating light to the surface of the semiconductor layer 130, the light may have energy with an energy band gap equal to or higher than that of the semiconductor layer 130. For example, the light may be an ultraviolet ray (UV).

Also, the light may be irradiated for 10 minutes to 20 minutes. However, a light irradiation time may not be limited thereto. The light irradiation time may be adjusted depending on the environment of light irradiation. For example, the light may be irradiated for less than 1 minute and up to 3 hours to 4 hours.

Moreover, the fluid may include a corrosion inhibitor. Therefore, it is possible to suppress corrosion of a part of the thin film transistor in contact with the fluid. For example, the corrosion inhibitor may include a cyclic amine compound. More specifically, the corrosion inhibitor may include one or more of pyrazole, imidazole, triazole, tetrazole, aminotetrazole, indole, purine, pyridine, pyrimidine, pyrrole, pyrrolidone, and pyrroline.

Also, the corrosion inhibitor may include a copper stabilizer. As the copper stabilizer, one or more of phosphate, glycols, cyclic amine, and the like may be used. For example, a thin film transistor implemented by the present method for manufacturing a thin film transistor includes copper, the corrosion inhibitor may desirably include the copper stabilizer.

Further, in another exemplary embodiment, the step of activating the semiconductor layer 130 may include performing a heat treatment (annealing) to the semiconductor layer 130. In other words, the semiconductor layer 130 may be activated by performing a heat treatment to the semiconductor layer 130 rather than irradiating light to the semiconductor layer 130.

The above-described step of activating the semiconductor layer 130 may be performed after the step S300.

Otherwise, according to the present method for manufacturing a thin film transistor, the step of activating the semiconductor layer 130 may be performed during the step S100. For example, the step of activating the semiconductor layer 130 may be performed at the same when the wiring layer 140 is formed on the semiconductor layer 130.

Figure 8E:
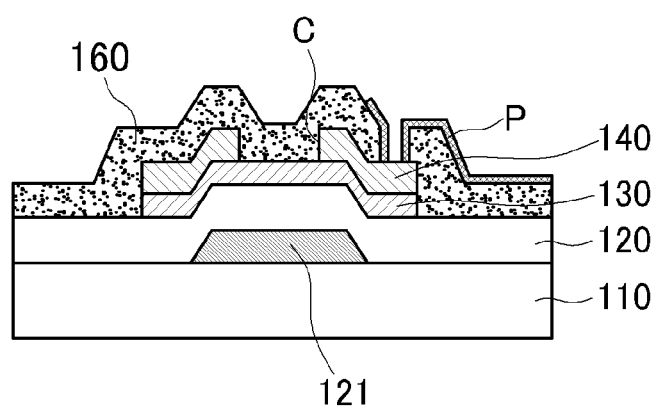

Referring to FIG. 8E, the present method for manufacturing a thin film transistor may further include forming a protection film layer 160 and a pixel electrode P (S500). The step of forming a protection film layer 160 and a pixel electrode P may be performed after the step S300.

Further, according to the present method for manufacturing a thin film transistor, after the step S300, the step of forming a gate insulation layer 120 and a gate electrode 121 may be performed. For example, if the thin film transistor having a top-gate structure illustrated in FIG. 2B is implemented, the step of forming a gate electrode 121 and a gate insulation layer 120 may be performed between the step S300 and the step S500.

Hereinafter, a thin film transistor (hereinafter, referred to as "present thin film transistor") according to the above-described method for manufacturing a thin film transistor according to an example of the present disclosure will be described. However, components identical or similar to those explained above in the method for manufacturing a thin film transistor according to an example of the present disclosure will be assigned identical reference numerals, and explanation thereof will be briefly provided or omitted.

Referring to FIG. 2A and FIG. 2B, the present thin film transistor includes the semiconductor layer 130 formed on the substrate 110 and the wiring layer 140.

Also, referring to FIG. 2A and FIG. 2B, the wiring layer 140 includes the compensation layer 141.

The compensation layer 141 is formed from a material including a metal of a metal oxide component among components of a material forming the semiconductor layer 130.

The compensation layer 141 can compensate for a loss of the semiconductor layer 130.

The semiconductor layer 130 may be formed from a material including one or more of $In_2O_3$, ZnO, $Ga_2O_3$, $SnO_2$, $TiO_2$, and HfO. Desirably, the semiconductor layer 130 may be formed from IGZO including indium, gallium, zinc, and oxygen.

Further, the compensation layer 141 may be formed from a material including one or more of molybdenum (Mo) and titanium (Ti).

As described above, for example, a material forming the compensation layer 141 may include one or more of molybdenum (Mo) and titanium (Ti) as main components, and also include one or more of Al, Zn, In, Ga, Sn, Ti, Hf, Ta, and W as secondary components. Particularly, the compensation layer 141 formed from a material including molybdenum (Mo) and zinc (Zn) may be implemented.

Furthermore, the material forming the compensation layer 141 may include a metal of a metal oxide component among components of a material forming the semiconductor layer 130 ranging from 5 at % to 70 at %.

Meanwhile, as illustrated in FIG. 2A and FIG. 2B, the wiring layer 140 may have a single structure including the compensation layer 141. In other words, the compensation layer 141 may be the wiring layer 141.

Referring to FIG. 7, the wiring layer 140 may include the metal layer 143 formed opposite to the semiconductor layer 130 with the compensation layer 141 interposed therebetween. In other words, as illustrated in FIG. 3, the wiring layer 140 may have a double structure including the compensation layer 141 and the metal layer 143. The metal layer 143 may include one or more of copper, a copper alloy, aluminum, an aluminum alloy, silver, a silver alloy, and the like.

Further, the wiring layer 140 may include the additional compensation layer formed opposite to the compensation layer 141 with the metal layer 143 interposed therebetween. In this case, although not illustrated in the drawing, the wiring layer 140 may be implemented as a triple structure including the compensation layer 141 formed on the semiconductor layer 130 and the metal layer 143 and the additional compensation layer formed in sequence on the compensation layer 141. A composition and a function of the additional compensation layer may be identical or similar to those of the compensation layer 141.

The wiring layer 140 may further include a transparent conductive layer formed opposite to the metal layer with the additional compensation layer interposed therebetween. In this case, the wiring layer 140 may be implemented as a quadruple structure including the compensation layer 141 formed on the semiconductor layer 130 and the metal layer 143, the additional compensation layer, and the transparent conductive layer formed in sequence on the compensation layer 141. The transparent conductive layer may be formed from a transparent conductive oxide (TCO).

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. A method for manufacturing a thin film transistor, the method comprising:
   forming a patterned metal oxide semiconductor layer and a patterned wiring layer on a substrate; and
   etching the wiring layer to form a channel part using an etchant,
   wherein the wiring layer includes a compensation layer,
   wherein the compensation layer is formed from a material including a metal of a metal oxide component among components of a material forming the metal oxide semiconductor layer,
   wherein the compensation layer adjusts for a loss of a surface composition of the metal oxide semiconductor layer and suppresses generation of residue during the etching of the wiring layer,
   wherein the loss of the surface composition and the generation of the residue are caused by the etchant, and
   wherein the wiring layer further includes:
      a metal layer formed opposite to the metal oxide semiconductor layer with the compensation layer interposed therebetween,
      an additional compensation layer formed opposite to the compensation layer with the metal layer interposed therebetween, and
      a transparent conductive layer formed opposite to the metal layer with the additional compensation layer interposed therebetween.

2. The method for manufacturing a thin film transistor of claim 1,
   wherein the material forming the metal oxide semiconductor layer includes one or more of $In_2O_3$, ZnO, $Ga_2O_3$, $SnO_2$, $TiO_2$, HfO, $Ta_2O_5$, and $Al_2O_3$.

3. The method for manufacturing a thin film transistor of claim 1,
   wherein the material forming the compensation layer further includes one or more of molybdenum and titanium.

4. The method for manufacturing a thin film transistor of claim 1,
   wherein the material forming the compensation layer includes molybdenum and zinc.

5. The method for manufacturing a thin film transistor of claim 1,
   wherein the material forming the compensation layer includes the metal ranging from 5 at % to 70 at %.

6. The method for manufacturing a thin film transistor of claim 1,
   wherein the wiring layer has a single structure including the compensation layer.

7. The method for manufacturing a thin film transistor of claim 1, further comprising:
   activating the metal oxide semiconductor layer.

8. The method for manufacturing a thin film transistor of claim 7,
   wherein the activating of the metal oxide semiconductor layer is performed during the forming of the patterned semiconductor layer and the patterned wiring layer on the substrate or after the etching of the wiring layer to form the channel part.

9. The method for manufacturing a thin film transistor of claim 7,
   wherein in the activating of the metal oxide semiconductor layer, light is irradiated to a surface of the metal oxide semiconductor layer.

10. The method for manufacturing a thin film transistor of claim 7,
    wherein in the activating of the metal oxide semiconductor layer, a heat treatment is performed to the metal oxide semiconductor layer.

11. A thin film transistor, comprising:
    a metal oxide semiconductor layer on a substrate, and
    a wiring layer on the metal oxide semiconductor layer,
       wherein the wiring layer includes a compensation layer,
       wherein the compensation layer is formed from a material including a metal of a metal oxide component among components of a material forming the metal oxide semiconductor layer,
       wherein the compensation layer adjusts for a loss of a surface composition of the metal oxide semiconductor layer and suppresses generation of residue during an etching process of the wiring layer, wherein the etching process uses an etchant,
       wherein the loss of the surface composition and the generation of the residue are caused by the etchant, and
    wherein the wiring layer further includes:
    a metal layer formed opposite to the metal oxide semiconductor layer with the compensation layer interposed therebetween,
    an additional compensation layer formed opposite to the compensation layer with the metal layer interposed therebetween, and
    a transparent conductive layer formed opposite to the metal layer with the additional compensation layer interposed therebetween.

12. The thin film transistor of claim 11,
    wherein the material forming the metal oxide semiconductor layer includes one or more of $In_2O_3$, ZnO, $Ga_2O_3$, $SnO_2$, $TiO_2$, HfO, $Ta_2O_5$, and $Al_2O_3$.

13. The thin film transistor of claim 11,
    wherein the material forming the compensation layer further includes one or more of molybdenum (Mo) and titanium (Ti).

14. The thin film transistor of claim 11,
    wherein the material forming the compensation layer includes molybdenum (Mo) and zinc (Zn).

15. The thin film transistor of claim 11,
    wherein the material forming the compensation layer includes the metal ranging from 5 at % to 70 at %.

16. The thin film transistor of claim 11,
    wherein the wiring layer has a single structure including the compensation layer.

17. The thin film transistor of claim 11, wherein the compensation layer comprises Zn alloy including one or more of molybdenum (Mo) and titanium (Ti).

* * * * *